(12) United States Patent
Amato

(10) Patent No.: US 11,611,211 B2
(45) Date of Patent: Mar. 21, 2023

(54) MULTIPLE TRIGGER ELECTROSTATIC DISCHARGE (ESD) PROTECTION DEVICE FOR INTEGRATED CIRCUITS WITH MULTIPLE POWER SUPPLY DOMAINS

(71) Applicant: Analog Devices, Inc., Wilmington, MA (US)

(72) Inventor: Michael Amato, Livermore, CA (US)

(73) Assignee: Analog Devices, Inc., Wilmington, MA (US)

( * ) Notice: Subject to any disclaimer, the term of this patent is extended or adjusted under 35 U.S.C. 154(b) by 130 days.

(21) Appl. No.: 17/234,465

(22) Filed: Apr. 19, 2021

(65) Prior Publication Data
US 2022/0337054 A1  Oct. 20, 2022

(51) Int. Cl.
  *H02H 9/04* (2006.01)
  *H01L 27/02* (2006.01)
  *H01L 29/747* (2006.01)
(52) U.S. Cl.
  CPC ......... *H02H 9/046* (2013.01); *H01L 27/0248* (2013.01); *H01L 29/747* (2013.01)
(58) Field of Classification Search
  CPC .... H02H 9/046; H01L 27/0248; H01L 29/747
  USPC .......................................................... 361/56
  See application file for complete search history.

(56) References Cited

U.S. PATENT DOCUMENTS

| | | | |
|---|---|---|---|
| 5,148,250 A | 9/1992 | Winnerl et al. | |
| 5,276,582 A | 1/1994 | Merrill et al. | |
| 5,625,280 A | 4/1997 | Voldman | |
| 5,774,318 A | 6/1998 | Mcclure et al. | |
| 5,850,095 A | 12/1998 | Chen et al. | |
| 6,731,488 B2* | 5/2004 | Voldman | H03K 17/08146 |
| | | | 361/111 |
| 6,891,230 B2 | 5/2005 | Yu | |

(Continued)

FOREIGN PATENT DOCUMENTS

| | | |
|---|---|---|
| CN | 104137251 | 12/2016 |
| DE | 62618131894 A1 | 6/2019 |

(Continued)

OTHER PUBLICATIONS

Haseloff, Eilhard, "Latch-Up, ESD, and Other Phenomena", Texas Instruments Application Report SLYA014A, (May 2000), 27 pgs.

(Continued)

*Primary Examiner* — Dharti H Patel
(74) *Attorney, Agent, or Firm* — Schwegman Lundberg & Woessner, P.A.

(57) ABSTRACT

A system having a device for conducting an electrostatic discharge (ESD) current from a designated pin node. The system includes first and second pin nodes, and a switching device having a first switching threshold. The switching device includes a first, terminal coupled to a reference node, and a second terminal, coupled to the first pin node to actuate the switching device to conduct ESD current from the first pin node responsive to a voltage between the first pin node and the reference node exceeding the first switching threshold. The switching device further includes a third terminal, coupled to the second pin node, to actuate the switching device to conduct ESD current from the first pin node responsive to a voltage between the first pin node and the second pin node exceeding a second switching threshold.

21 Claims, 10 Drawing Sheets

(56) References Cited

U.S. PATENT DOCUMENTS

| | | |
|---|---|---|
| 8,169,760 B2 | 5/2012 | Chang et al. |
| 8,247,839 B2 | 8/2012 | Van Wijmeersch |
| 8,354,722 B2 | 1/2013 | Campi, Jr. et al. |
| 8,455,947 B2 | 6/2013 | Shrivastava et al. |
| 8,686,470 B2 | 4/2014 | Ritter |
| 9,165,919 B2 | 10/2015 | Matsumoto et al. |
| 9,704,850 B2 | 7/2017 | Quax et al. |
| 9,843,183 B2 * | 12/2017 | Lv .................... H02H 9/046 |
| 9,881,914 B2 | 1/2018 | Sorgeloos et al. |
| 9,997,509 B2 * | 6/2018 | Chaudhry ........... H01L 27/0259 |
| 10,056,364 B1 | 8/2018 | Klebanov et al. |
| 10,497,696 B2 | 12/2019 | Zhan et al. |
| 2008/0297960 A1 | 12/2008 | Chen |
| 2013/0200493 A1 | 8/2013 | Sorgellos et al. |
| 2019/0273488 A1 * | 9/2019 | Reiter .................. H02H 7/222 |

FOREIGN PATENT DOCUMENTS

| | | |
|---|---|---|
| EP | 0413054 A1 | 2/1991 |
| KR | 20200066853 A | 6/2020 |

OTHER PUBLICATIONS

"International Application Serial No. PCT/US2022/070695, International Search Report dated May 12, 2022", 5 pgs.

"International Application Serial No. PCT/US2022/070695, Written Opinion dated May 12, 2022", 6 pgs.

\* cited by examiner

MULTIPLE TRIGGER ELECTROSTATIC DISCHARGE (ESD) PROTECTION DEVICE FOR INTEGRATED CIRCUITS WITH MULTIPLE POWER SUPPLY DOMAINS

FIELD OF THE DISCLOSURE

This document pertains generally, but not by way of limitation, to electronic circuits and, more particularly, to electrostatic discharge protection devices for electronic circuits.

BACKGROUND

Electronic circuits, such as circuits incorporating one or more semiconductor devices, can be susceptible to stress or damage caused by electrostatic discharge (ESD) events. ESD events include fast transient voltage spikes or overvoltage conditions generated by static electricity or power supply voltage transients and the like. ESD protection circuitry can work in corporation with other components of electronic circuits to mitigate the damage caused by ESD events by sinking or diverting current associated with an ESD event away from a protected circuit node. Examples of ESD protection circuitry include semiconductor-based switching devices, such as field effect transistors (FETs) or semiconductor controlled rectifiers (SCRs), that are configured to inhibit current flow during normal operation of an electronic circuit and to create a low impedance path between a protected circuit node and a current sink, such as a reference node (e.g., a power rail), during or in response to an ESD event. Examples of such switching devices (hereinafter, "ESD device") are discussed in U.S. Pat. No. 8,891,213 B2, which is titled "Integrated electrostatic discharge (ESD) device" and was granted to Chi Kang Liu et al on Nov. 18, 2014. The '213 patent discusses a transistor-based ESD device that includes a "a bipolar junction transistor formed beneath a standard NFET device that includes a source region in a substrate, a channel region in the substrate laterally adjacent to the source region, a drain region in the substrate laterally adjacent to the channel region and a gate above the channel region of the substrate." In another example, an ESD device includes a silicon controlled rectifier, such as described in U.S. Pat. No. 6,770,918 B2, which is titled "Electrostatic discharge protection silicon controlled rectifier (ESD-SCR) for silicon germanium technologies" and was granted on Aug. 3, 2004 to Cornelius Christian Russ et al.

SUMMARY OF THE DISCLOSURE

A system having a device for conducting an electrostatic discharge current from a designated pin node. The system includes first pin and second pin nodes, and a switching device having a first switching threshold. The switching device includes a first terminal coupled to a reference node, and a second terminal, coupled to the first pin node to actuate the switching device to conduct ESD current from the first pin node responsive to a voltage between the first pin node and the reference node exceeding the first switching threshold. The switching device further includes a third terminal, coupled to the second pin node, to actuate the switching device to conduct ESD current from the first pin node responsive to a voltage between the first pin node and the second pin node exceeding a second switching threshold.

This summary is intended to provide an overview of subject matter of the present patent application. It is not intended to provide an exclusive or exhaustive explanation of the invention. The detailed description is included to provide further information about the present patent application.

Figure 1:
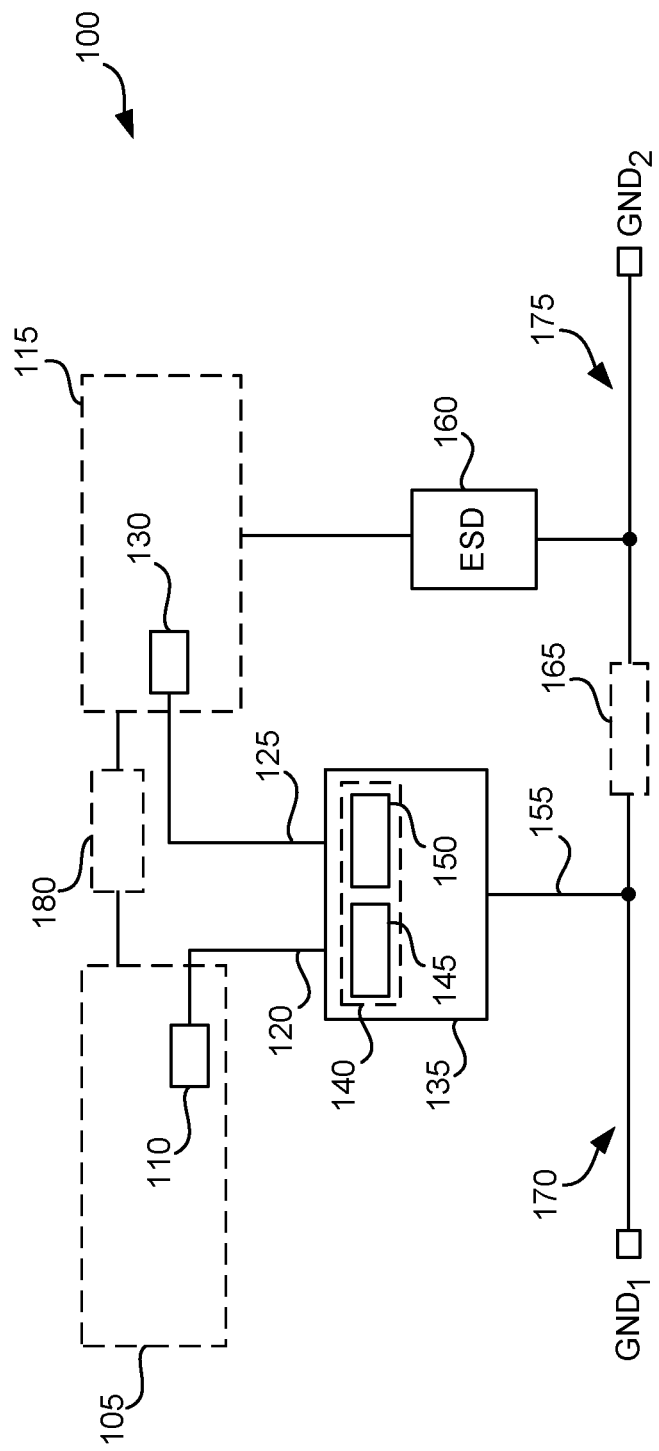
FIG. 1 illustrates a diagram of an example of circuitry including an ESD device having two or more triggers for providing ESD protection.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Aspects of the present disclosure include techniques for an ESD device that is configured with two or more triggers for turning on the ESD device to conduct ESD current away from a protected node of an electronic circuit. These techniques include improving bipolar junction transistor (BJT), SCR, or bidirectional triode thyristor (TRIAC) based ESD devices by adding one or more additional NPN regions that, when coupled to a device terminal and connected to a designated circuit node, can operate as a second trigger for activating the ESD device. The second trigger can turn on an ESD device faster or at lower voltages as compared to unimproved ESD devices, thereby providing enhanced ESD protection to electronic circuits. The ESD devices described herein can be particularly useful for protecting electronic devices that include circuitry that is disposed between, or that cross, two or more power domains (e.g., devices that include circuitry that is disposed between high voltage and low voltage power domains, such in a regulated power supply circuit). These ESD devices can be fabricated using standard library cells for BJT, SCR, or TRIAC-based ESD devices without significantly changing the size or geometry of the devices. Such devices can also be incorporated in electronic circuits without requiting complex support circuitry.

Electronic circuits can include two or more power supplies that each define a different power domain. Circuit components, or circuitry, in the first power domain can be coupled to power and reference nodes of a first power supply, while circuitry in a second power domain is can be coupled power and reference nodes of a second power supply. In some situations, one or more circuit components can be coupled across power domains, such as by being connected to power or reference nodes in both the first and second power domains. Circuitry in each power domain typically include ESD devices, or ESD protection circuitry, that are coupled between a power node and an associated reference node to provide protection during an ESD event. Circuit components that are coupled across power domains, however, can experience greater stress, as compared to other circuit components, during an ESD event. Techniques for mitigating damage caused by this additional stress include fabricating the affected components to make them more rugged or resilient to ESD events or incorporating additional ESD protection circuitry that is specially configured to components that cross power domains.

In an example, an electronic circuit includes circuitry, such as voltage regulator, that uses power obtained a first power node having a first voltage to provide power a second power node having a lower voltage. The circuit can include ESD protection circuitry that is coupled between the first power node and an associated reference node (e.g., a ground node) to protect circuitry in a first power domain defined by the first power node during an ESD event. The circuit can also include ESD protection circuitry that is coupled between the second power node an associated reference node to protect circuitry in a second power domain defined by the second power node. During an ESD event where an ESD pulse is applied between the first and second power nodes, the voltage regulator is coupled directly across the two power nodes while ESD current must flow through the ESD protection circuitry and any parasitic devices, such as parasitic diodes, of the circuit. This causes the voltage regulator to experience higher stress than experienced by circuit components that are only coupled to one of the two power domains. Techniques for mitigating the effects of this additional stress include adding additional ESD protection circuitry between the first and second power nodes, using a voltage regulator that is ruggedized to survive the ESD event, or using a voltage regulator a having higher operating voltage.

Each of these techniques for compensating for the increased stress experienced by circuit components that are coupled across power domains, can increase the size, complexity, or cost of a particular circuit, or may impair or reduce the overall performance of the circuit. In an example, because ESD devices are typically triggered based on a single trigger voltage determined by physical characteristics of the device, such as the breakdown voltage of a transistor or SCR, lowering the voltage at which such devices trigger during an ESD event may require additional circuit components and may reduce the operating range or operating margins of the circuit.

Examples of the present disclosure include semiconductor based ESD devices having two or more triggers for causing the ESD device to conduct current away from a protected node during an ESD event. Such semiconductor-based ESD devices include BJT, SCR, or TRIAC-based ESD devices that are modified to include one or more additional triggers for turning on the ESD device to conduct current responsive to a signal received during an ESD event. The additional trigger can include a new device terminal, region, semiconductor junction, or any combination thereof. The additional trigger and the standard device trigger can be co-located within a control region of the ESD device so as to modify the physical switching characteristics of the device, such as by configuring the ESD device to trigger or switch at one or more different threshold voltages. Such modifications can include causing the ESD device to turn on responsive to disparate signals applied to each trigger. Such modifications can improve the switching speed of the ESD device or provide a lower switching voltage without significantly changing the size or geometry of the ESD device or requiring additional support circuitry.

FIG. 1 illustrates an example of circuitry 100 including an ESD device 135 having two or more triggers for providing ESD protection. Circuitry 100 can include one or more circuit components, such semiconductor switches, that are susceptible to damage cause by ESD events. In an example, circuitry 100 includes circuitry 105 having node 110, circuitry 115 having node 130, and circuitry 180. Circuitry 105 is coupled to a first node (e.g., a power node) and to an associated reference node 170 within a first power domain. Circuitry 115 is coupled to a second node (e.g., a power node) and to an associated reference node 175 within a second power domain. Circuitry 180 is coupled to circuitry 105 and 115 to communicate signals between the first and second power domains. ESD devices 135 and 160 are coupled, respectively, to circuitry 105 and 115 and to their corresponding references nodes 170 and 175. In an example, the first and second nodes are nodes of distinct power supplies having independent voltages. The voltage at the first node can be higher, lower, or substantially identical to the voltage at the second node. In another example, a signal at the second node is derived from a signal at the first node, such as in a circuit configuration where voltage or current of the first node Or a first power supply) is used to provide a voltage or current of the second power node (or second power supply). Reference nodes 170 and 175 can be electrically isolated from each other, physically connected so as to form a single reference node or coupled together through one or more parasitic or physical circuit component, such as component 165. In an example, the node 110 include node that is configured to be protected from stress or damage during an ESD event. In another example, nodes 110 and 130 include, respectively, the first and second nodes.

ESD device 135 is can include any of the ESD devices described herein that are improved to have two or more switching triggers or switching threshold voltages. In an example, ESD device 135 includes a first terminal 120 coupled to node 110, a second terminal 125 coupled to node 130, and a third terminal 155 coupled to reference node 170. As shown in FIG. 1, ESD device 135 includes at least a first and second trigger, coupled respectively to terminals 120 and 125. The first and second triggers are formed, respectively, by first and second semiconductor regions 145 and 150. The first and second semiconductor regions 145 and 150 are co-located separately (e.g., spaced apart) within a control region 140. As a result of this co-location, PN junctions formed at the interfaces between the semiconductor regions 145 and 150, the control region 140, and other regions of the ESD device, are biased into conduction responsive to threshold voltages or other suitable signals being applied to either semiconductor region and can trigger the ESD device to turn on.

In normal operation of circuitry 100, ESD device 135 is turned off and appears as an open circuit or a high impedance path for electrical current flow. During an ESD event, the ESD device 135 is triggered to turn on, such as by a voltage at node 110 that exceeds a first threshold voltage or by a voltage at node 130 that exceeds a second threshold voltage, and can conduct and ESD current from node 110 to reference node 170. In an example, the first and second threshold voltages are determined by a physical characteristic of ESD device 135, such a reverse breakdown voltage of device.

In an example, terminal 120 is coupled to the standard trigger of the ESD device 135 and configured to conduct current from node 110 to reference node 170. In another example, terminal 125 is coupled to a second ESD device trigger. The second trigger can be configured as only a trigger mechanism, such that once ESD device 135 is turned on by a signal applied to terminal 125, ESD current has a low impedance path to flow from node 110 through terminals 120 and 155 to reference node 170 and high impedance path though terminal 125. The second trigger can be configured to provide a low impedance path for current flow, such that once the ESD device 135 is turned on by a signal applied to terminal 125, ESD current has a low impedance path to flow from node 110 though terminals 120, 125 and 155 to nodes 130, 170, or 175.

Figure 2:
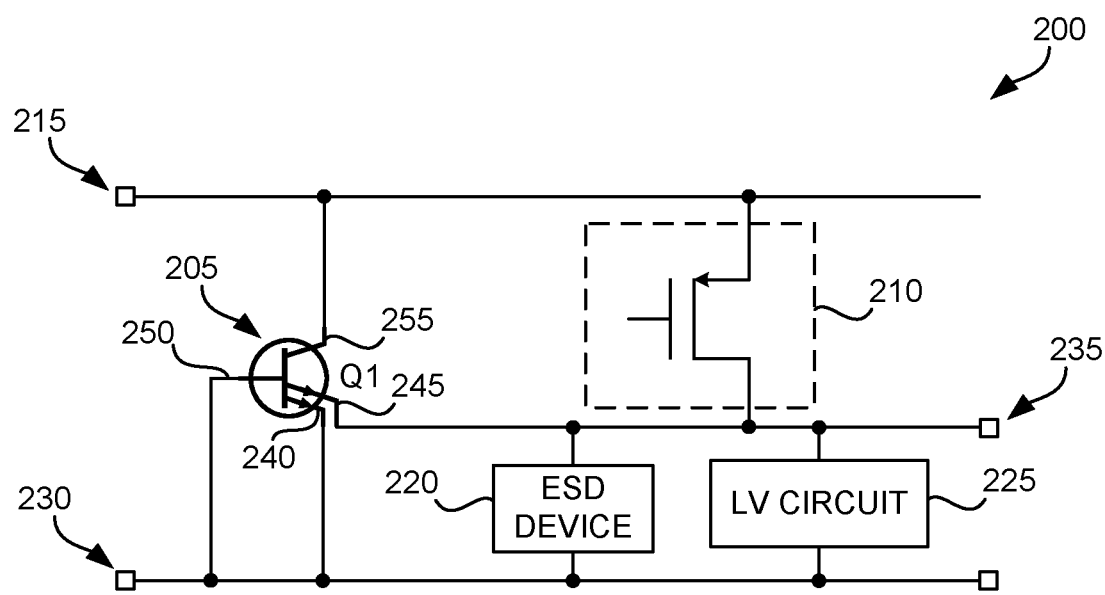
FIG. 2 illustrates a diagram of an example of circuitry including a bipolar junction transistor based ESD device having at least two emitter triggers for providing ESD protection.

FIG. 2 illustrates an example of circuitry 200 including an NPN or BJT-based ESD device (hereinafter, "BJT ESD device") 205 that is configured with at least two emitters for providing ESD protection. Circuitry 200 is an example of circuitry 100 with BJT ESD device 205 corresponding to the ESD device 135, low voltage circuit 225 corresponding to circuitry 115, and ESD device 220 corresponding to ESD device 160. Additionally, nodes 215 and 235 (e.g., pin nodes or power nodes) correspond to nodes 110 and 130, and reference node 230 corresponds to reference nodes 170 and 175. Circuitry 210 corresponds to circuitry 180 and is an example of any circuitry or circuit component that is coupled across two or more power domains of the circuitry 200. In an example, circuitry 210 is a voltage regulator that is coupled to a first power node, such as node 215, and is configured to provide power at a second power node, such as node 235.

In an example, BJT ESD device 205 includes base 250 (e.g., a control terminal), collector 255, emitter 240 and emitter 245. BJT ESD device 205, in various examples, is fabricated such that the semiconductor regions of the ESD device that form emitters 240 and 245 are co-located the semiconductor region that forms base 250. As shown in FIG. 2, BJT ESD device 205 has a shorted base configuration with respect to emitter 240 due to both base 250 and emitter 240 being electrically shorted to the same node (e.g., node 230).

This configuration of BJT ESD device 205 defines a first trigger for turning on the BJT ESD device based on the bipolar breakdown voltage, $BV_{ces}$, between the collector 255 and the emitter 240. According to this configuration, a signal, such as a voltage spike during an ESD event, applied to node 215, or to the collector 255, will trigger BJT ESD device 205 to conduct current from node 215 responsive the signal causing the voltage difference between collector 255 and base 250 to exceed $BV_{ces}$. BJT ESD device 205 also has an open base configuration with respect to emitter 245 due to base 250 and emitter 245 being electrically isolated. This configuration defines a second trigger of BJT ESD device 205 based on the bipolar open base breakdown voltage, $BV_{ceo}$, between collector 255 and emitter 245. According to this second configuration, a signal applied to collector 255, or to emitter 245, will trigger BJT ESD device 205 to conduct current from node 215 responsive the signal causing the voltage difference between the collector and the emitter to exceed $BV_{ceo}$.

In normal operation, the PN junction between base 250 and collector 255 is reversed biased and therefore have little or no effect on the operation or performance of circuitry 200. Additionally, the PN junction formed by base 250 and emitter 240 inhibits current flow due to the electrical short between these two regions of BJT ESD device 205. Furthermore, the PN junction formed by base 250 and emitter 245 is configured to inhibit current flow during normal operation of circuitry 200 due the co-location of emitter 245 in the base region of BJT ESD device 205. During an ESD event where node 215 is driven positive with respect to node 235 (or responsive to collector 255 being driven positive with respect to emitter 245), emitter 245 becomes negatively biased with respect to base 250. The negatively biased emitter 245 causes BJT ESD device 205 to turn on at a lower voltage (e.g., $BV_{ceo}$) or faster than the ESD device would trigger without the presence of emitter 245, thereby reducing ESD stress on circuitry 210. Triggering BJT ESD device 205 using emitter 245 can create a low impedance path between emitter 245 and collector 255, thereby creating a direct path for ESD current to flow between nodes 215 and 235. This direct path can provide further ESD stress reduction by bypassing or circumventing the substrate or parasitic devices that are normally present in the ESD protection circuitry current path.

Figure 3A:
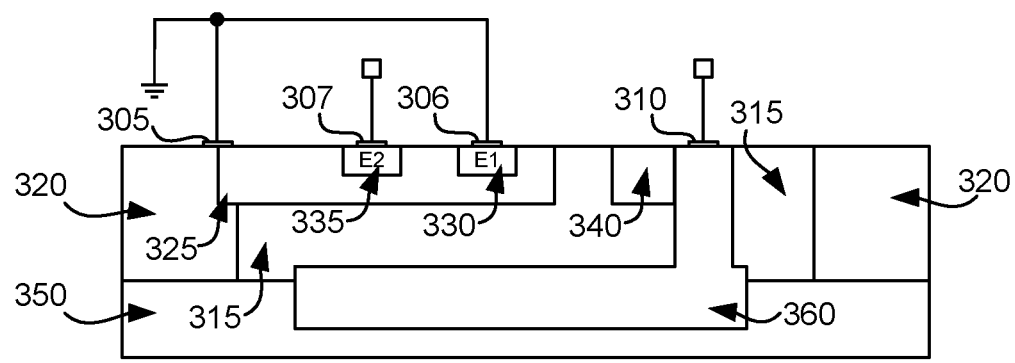
FIGS. 3A-3C illustrate cross-sectional diagrams of examples of bipolar junction transistor-based ESD devices that each have at least two emitter triggers to provide ESD protection.
Figure 3B:
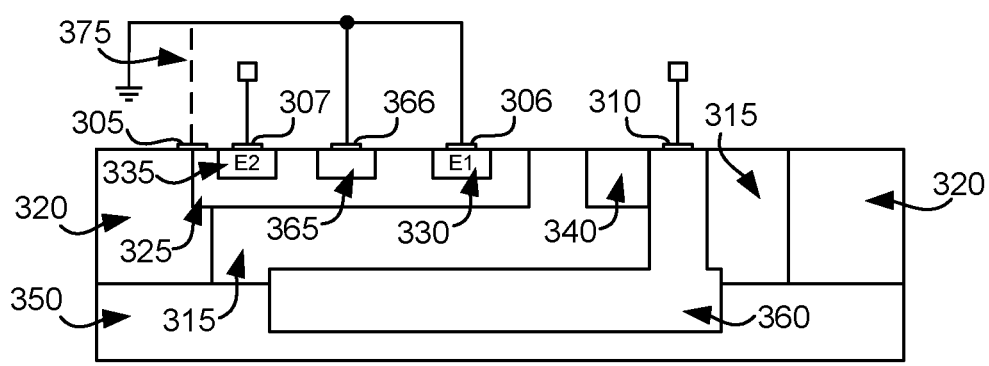
Figure 3C:
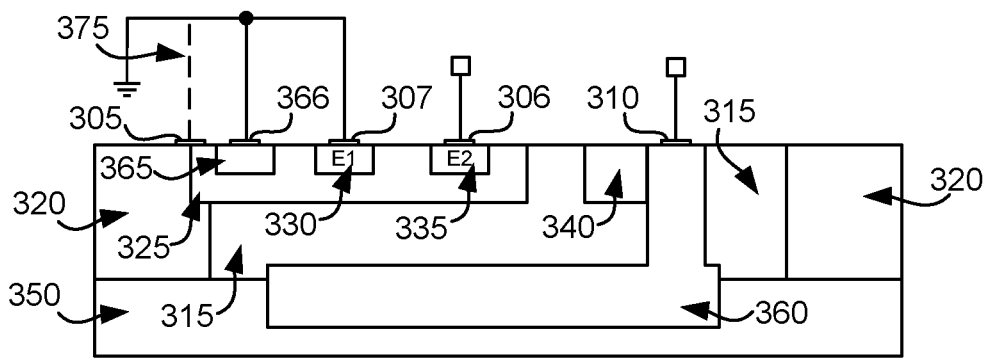

FIGS. 3A-3C illustrate cross-sectional diagrams of examples of BJT ESD device 205. The cross-section diagrams illustrate examples of different structural configurations of BJT ESD device 205. In an example, each configuration of BJT ESD device 205 illustrated in FIGS. 3A-3C is a modified BJT ESD device, where the modification includes the addition of a second emitter or emitter region that is co-located with a first emitter or emitter region in a base region of the ESD device, as described herein. The second emitter operates as a second trigger for turning on BJT ESD device 205.

As shown in FIG. 3A, BJT ESD device 205 can be fabricated on a substrate 350, such as p-type silicon, germanium, or any of their variants or any, other suitable substrate. In an example, BJT ESD device 205 includes base region 325 that is coupled to electrical contact 305 (e.g., a metallization region, such as region of aluminium) to form base 250, emitter region 330 that is coupled to electrical contact 306 to form the emitter 240, emitter region 335 that is coupled to the electrical contact 307 to form the emitter 245, and collector region 360 that is coupled to electrical contact 310 to form the collector 255. Base region 325, in various examples, includes one or more p-type regions (e.g., a p-well). Base region 325 can be coupled to a reference node, such as node 230, and to the substrate of BJT ESD device 205 through connection to heavily doped p-type isolation structure or region 320. Emitter regions 330 and 335 include separate, or spaced apart, n-type regions (e.g., n-wells) that are co-located within base region 325. Collector region 360 includes a buried n-type region that extends laterally under emitter regions 330 and 335 and under at least a portion of base region 325. Collector region 360 can be vertically and laterally spaced apart from base region 325 by n-type epitaxial layer 315 or optional n-type region 340. As shown in FIG. 3A, emitter region 330 is laterally disposed between emitter region 335 and a contact region to collector region 360. Additionally, emitter region 335 is disposed laterally between the base electrical contact 305 and emitter region 330.

FIG. 3B illustrate a configuration of BJT ESD device 205 where base region 325 includes a base contact region 365. In an example, base contact region 365 is a p-type region having a dopant concentration that is higher than the dopant concentration of base region 325. Base contact region 365 can reduce the electrical impedance between the base region 325 and the electrical contact 366. As shown in FIG. 3B, emitter region 330 is disposed laterally between base contact region 365 and the contact region to collector region 360. Additionally, base contact region 365 is disposed laterally between emitter region 335 and emitter region 330. Electrical contact 305 can be included to couple base region 325 to substrate 350, such as though isolation region 320. Electrical contact 305 can provide an electrical connection 375 between substrate 350 and a circuit node, such as reference node 230. During operation of circuitry 200 having BJT ESD device 205 configured as shown in FIG. 3B, a majority of ESD current conducted by WIT ESD device 205 can flow from collector region 360 to emitter region 330.

FIG. 3C illustrates a modified version of the configuration of BJT ESD device 205 as shown in FIG. 3B, with the modification including disposing emitter regions 330 and 335 laterally between base contact region 365 and the contact region to the collector region 360.

Figure 4:
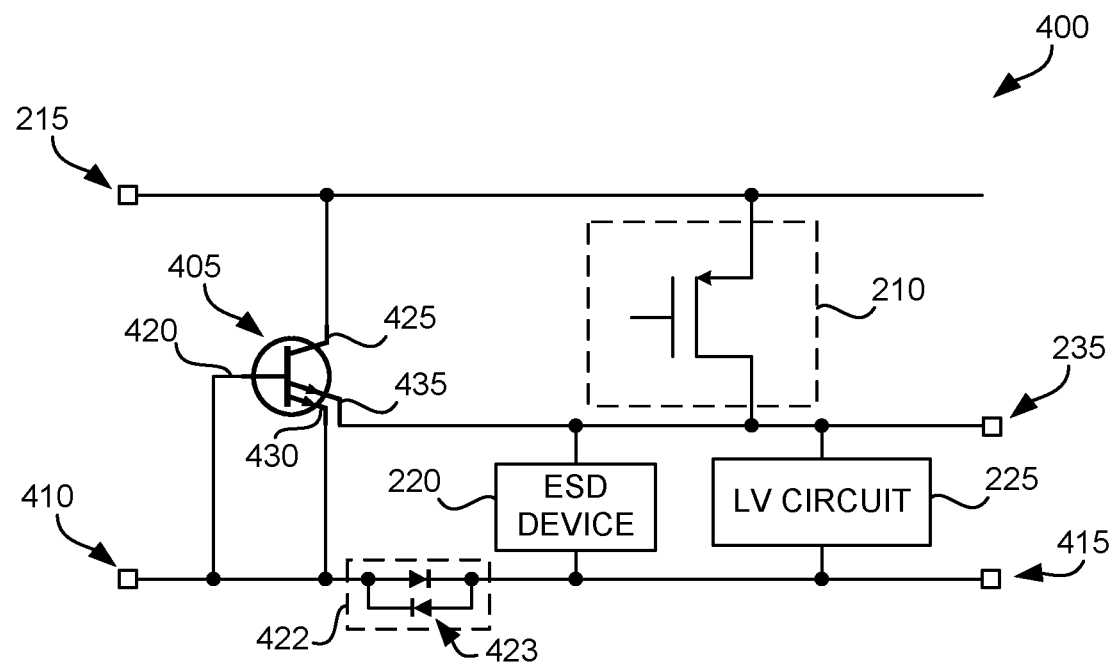
FIG. 4 illustrates a diagram of an example of circuitry including a bipolar junction transistor-based ESD device having an isolated base and configured with at least two emitter triggers to provide ESD protection.

FIG. 4 illustrates an example of circuitry 400 including a BJT ESD device 405 having an isolated base and configured with at least two emitters to provide ESD protection. Circuitry 400 is a modified example of circuitry 200, with the modification including the replacement of BJT ESD device 205 with BJT ESD device 405 and the substitution of reference nodes 410 and 415 for reference node 230. Base 420, collector 425, and emitters 430 and 435 of BJT ESD device 405 correspond to base 250, collector 255, and emitters 240 and 245 of BJT ESD device 205. BJT ESD device 405 is modified from BJT ESD device 205 such that base 420 is not internally connected to the substrate of the ESD device. This modification enables a free choice in where to connect base 420 and emitter 430, thereby enabling use of BJT ESD device 405 in circuitry or systems that require isolated or indirectly coupled reference nodes, such as reference nodes 410 and 415. As shown in FIG. 4, reference nodes 410 and 415 can be isolated or indirectly coupled together, such as though parasitic or coupling circuitry 422. In an example, parasitic or coupling circuitry 422 includes a set of anti-parallel diodes 423.

Figure 5A:
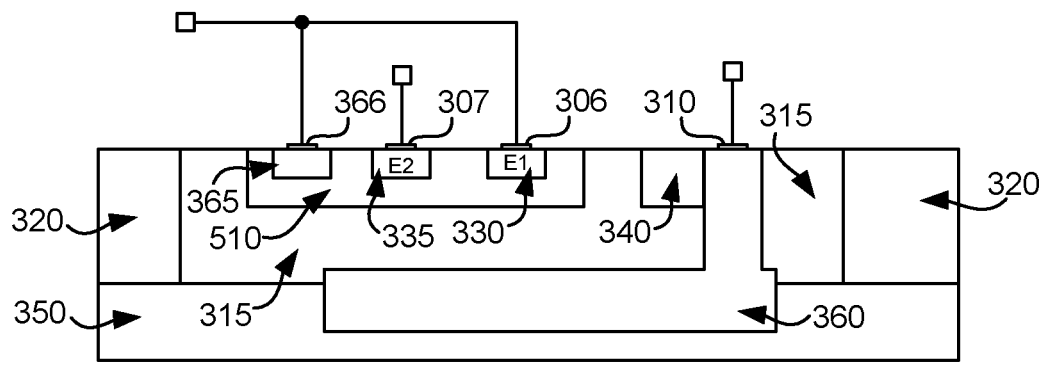
FIGS. 5A-5C illustrate cross-sectional diagrams of examples of bipolar junction transistors that each have isolated bases and are each configured with at least two emitter triggers to provide ESD protection.
Figure 5B:
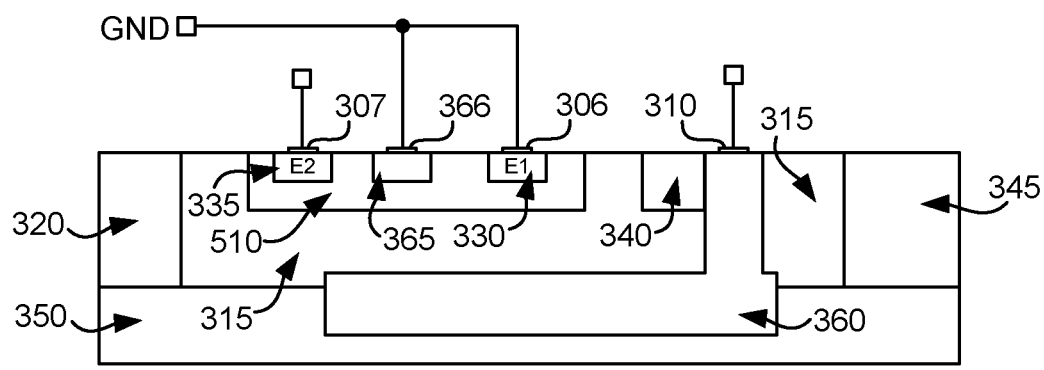
Figure 5C:
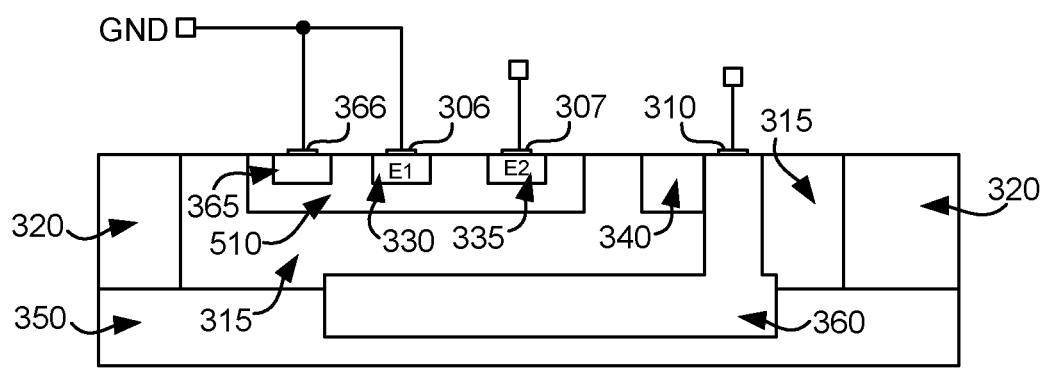

FIGS. 5A-5C illustrate cross-sectional diagrams of examples of the BJT ESD device 405. The cross-section diagrams illustrate examples of different structural configurations of BJT ESD device 405. In an example, each configuration of BJT ESD device 405 illustrated in FIGS. 5A-5C is a modified BJT ESD device, with the modifications including the addition of a second emitter or emitter region that is co-located with a first emitter or emitter region in a base region of the ESD device, as described herein.

FIG. 5A illustrates a configuration of BJT ESD device 405 where base region 510 is spaced apart from isolation region 320. This configuration enables improved electrical isolation between base region 510, emitter regions 330 and 335, and device substrate 350. As shown in FIG. 5A, emitter regions 330 and 335 are disposed laterally between base contact region 365 and the contact region to collector region 360. During operation of circuitry 400 having BJT ESD device 405 configured as shown in FIG. 5A, substantially equal ESD current can be discharged from collector region 360 through emitter regions 330 and 335.

FIG. 5B illustrates a modified version of the configuration of the BJT ESD device 405 shown in FIG. 5A, with the modification including disposing emitter region 330 laterally between base contact region 365 and the contact region to collector region 360. The modification also includes disposing base contact region 365 laterally between emitter region 335 and emitter region 330. In an example, this configuration BJT ESD device 405 provides improved electrical isolation between the base region 510, emitter regions 330 and 335, and substrate 350. In another example, this configuration of BJT ESD device 405 also provides a lower impedance electrical path, with respect to emitter region 335, for current to flow from collector region 360 through emitter region 330. This lower impedance path causes a majority of the ESD current to flow though emitter region 330 rather than emitter region 335.

Figure 6:
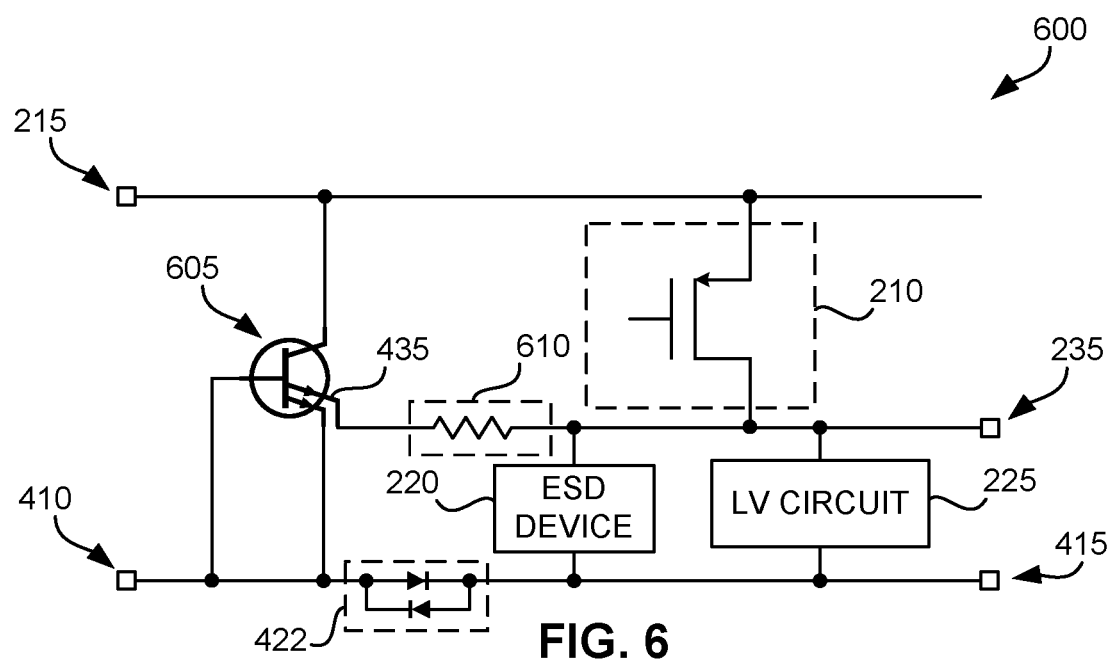
FIG. 6 illustrates a diagram of an example of circuitry including a bipolar junction transistor-based ESD device having at least two emitter triggers to provide multiple trigger ESD protection.

FIG. 5C illustrates a modified version of the configuration of the BJT ESD device 405 shown in FIG. 5A, with the modification including laterally disposing emitter regions 330 and 335 between the base contact region 365 and the contact region to collector region 360. In an example, the illustrated configuration of BJT ESD device 405 provides improved electrical isolation between base region 510, emitter regions 330 and 335, and device substrate 350. In another examples, the illustrated configuration of BJT ESD device 405 provides substantially similar low impedance paths for ESD current to flow from collector region 360 through emitter regions 330 and 335, FIG. 6 illustrates an example of circuitry 600 including a BJT ESD device 605 configured with at least two emitter triggers to provide ESD protection. Circuitry 600 is a modified configuration of circuitry 400, with the modification including the inclusion of impedance device 610, or other resistive element, in the current path between emitter 435 and node 235. Impedance device 610 can be included any circuitry described herein. Impedance device 610 can include a resistor or any other suitable impedance device. The impedance value of impedance device 610 can be selected to inhibit the flow ESD current through the emitter 435 when BJT ESD 605 device is triggered into conduction.

Figure 7A:
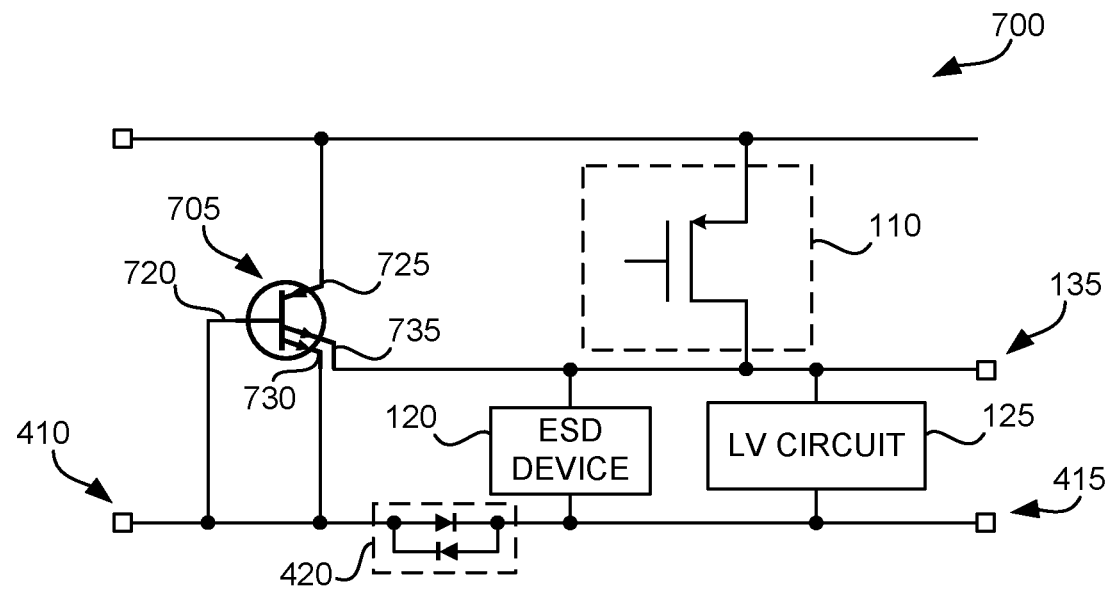
FIG. 7A illustrates a cross-sectional diagram of an example of circuitry including a semiconductor-controlled rectifier-based. ESD device having at least two cathode triggers to provide multiple trigger ESD protection.

FIG. 7A illustrates an example of circuitry 700 including an NPNP or SCR-based ESD device (hereinafter, "SCR ESD device") 705 having at least two cathodes to provide ESD protection. In an example, circuitry 700 is a modified configuration of the circuitry 400, with the modification including the replacement of BJT ESD device 405 with SCR ESD device 705. SCR ESD device 705 includes a gate 720, an anode 725, and cathodes 730 and 735. SCR ESD device 705 operates in a substantially similar way to the BJT ESD devices described herein. In an example, a signal, such as a voltage spike caused by an ESD event, at the anode 725 triggers SCR ESD device 705 to conduct a current through anode 725 to cathode 730 responsive to the signal causing a potential difference between anode 725 and cathode 730 to exceed the breakdown voltage, such as $BV_{ces}$, of the ESD device. The SCR ESD device 705 can be turned on faster or at a lower voltage by a second trigger actuated by a voltage difference between anode 725 and cathode 735 exceeding a second breakdown voltage, such as $BV_{ceo}$.

Figure 7B:
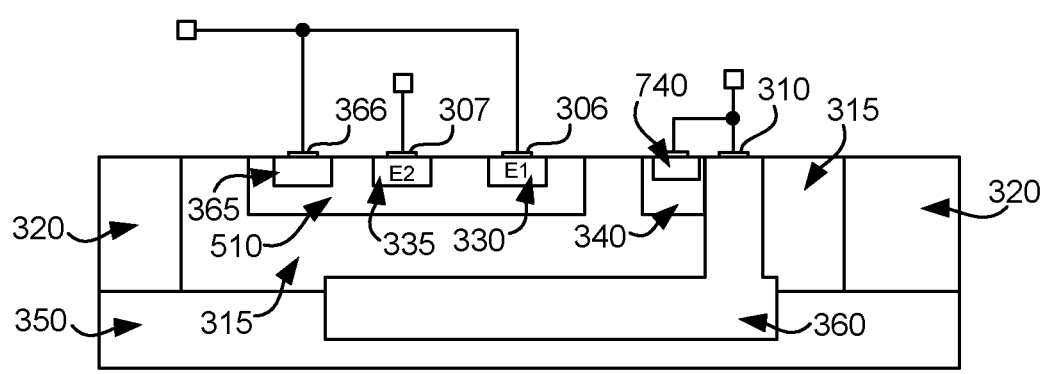
FIG. 7B illustrates a cross-sectional diagram of an example of a semiconductor-controlled rectifier-based ESD device having at least two cathode triggers for providing ESD protection.

FIG. 7B illustrates a cross-sectional diagram of an example of SCR ESD device 705. As shown in FIG. 7B, SCR ESD device 705 is a modified example of BJT ESD device 405 as illustrated in FIG. 5A, with the modification including the addition of contact region 740. In an example, contact region 740 is a p-type contact region. In some examples, the modification includes an electrical connection between contact region 740 and cathode or collector region 360. In an example, the electrical connection can include a short circuit or low impedance path connecting contact region 740 and the cathode or collector region 360. In another example, the electrical connection includes one or more circuit elements, such as a resistor, that connects contact region 740, electrical contact 310, n-type region 340, or collector region 360. SCR ESD device 705 can be fabricated to include any of the structural elements or configurations of the devices shown in FIGS. 3A-3C, 5A-5C, and circuitry 600, including the addition of contact region 740 or an electrical connection between contact region 740 and cathode or collector region 360.

Figure 8A:
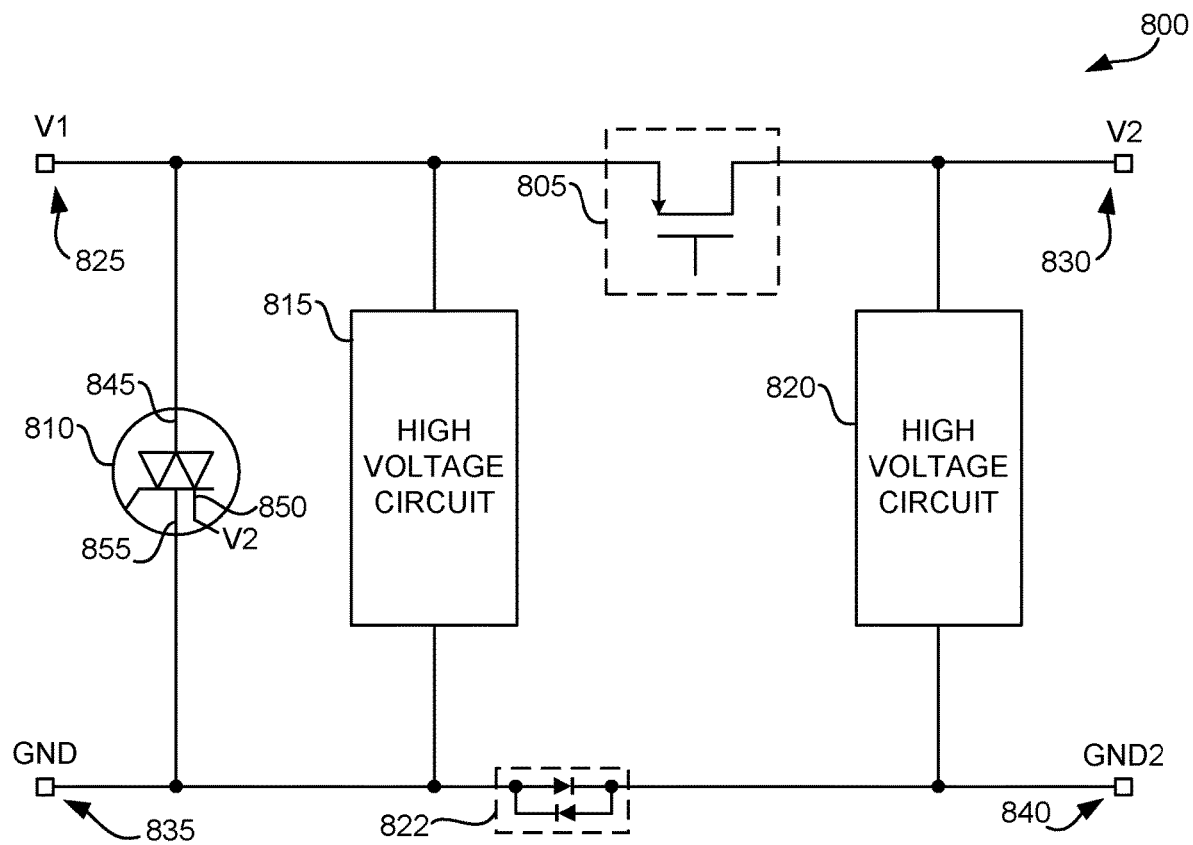
FIG. 8A illustrates a cross-sectional diagram of an example of circuitry including a high voltage semiconductor-controlled rectifier having at least two triggers to provide ESD protection.

FIG. 8A illustrates an example of circuitry 800 including a high voltage SCR ESD device 810 having at least two triggers to provide ESD protection. Circuitry 800 is an example of circuitry 100, with SCR ESD device 810 corresponding to ESD device 135, high voltage circuitry 815 corresponding to circuitry 105, and high voltage circuitry 820 corresponding to circuitry 115. Additionally, nodes 825 and 830 correspond, respectively, to nodes 110 and 130, and reference nodes 835 and 840 correspond, respectively, to reference nodes 170 and 175. In an example, the node 825 is a first power supply node and defines a first power domain with associated reference node 835. In an example, the node 830 is a second power supply node and defines a second power domain with associated reference node 840. Circuitry 805 corresponds to circuitry 180 and can include any circuitry or circuit component that is coupled across two or more power domains of the circuitry 800, such as the described first and second power domains. Reference nodes 835 and 840 can be isolated from each other, physically connected so as to form a single reference node, or coupled together through one or more parasitic or physical circuit components 822. In an example, the parasitic or coupling circuitry 822 includes a set of anti-parallel diodes.

In normal operation of circuitry 800, SCR ESD device 810 is off and appears as a high impedance current path between node 825 and reference node 835. An ESD event at node 825 that causes a voltage spike that exceeds the breakdown voltage for the PN regions between anode 845 and cathode 855 can trigger SCR ESD device 810 to turn on and conduct or sink current from node 825 to the reference node 835. SCR ESD device 810 can also be triggered to turned on by an ESD event at node 830 that causes a voltage spike that exceeds the breakdown voltage for the PN regions between anode 845 and cathode 850.

Figure 8B:
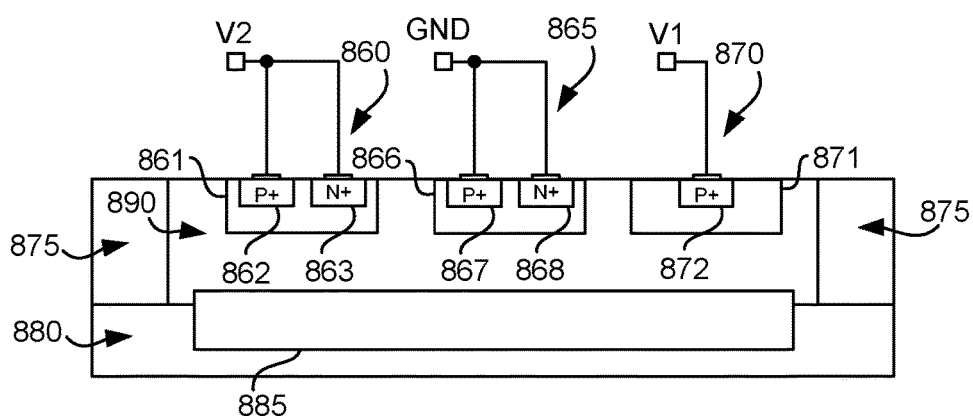
FIG. 8B illustrates a cross-sectional diagram of an example of a high voltage semiconductor-controlled rectifier that is configured with at least two triggers to provide ESD protection.

FIG. 8B illustrates a cross-sectional diagram of an example of SCR ESD device 810. As shown in MG. 8B, SCR ESD device 810 includes cathode 860 formed in p-type region 861 by n+ region 863, cathode 865 formed in p-type region 866 by n+ region 868, and anode 870 formed in p-type region 871 and in some example, may include p+ region 872. SCR ESD device 810 further includes isolation structure or region 875, gate region 890, buried n+ region 885 and a p-type substrate 880. Cathodes 860 and 865 correspond, respectively, to the cathodes 850 and 855. In some examples, SCR ESD device 810 further includes p+ regions 862 and 867.

Figure 9:
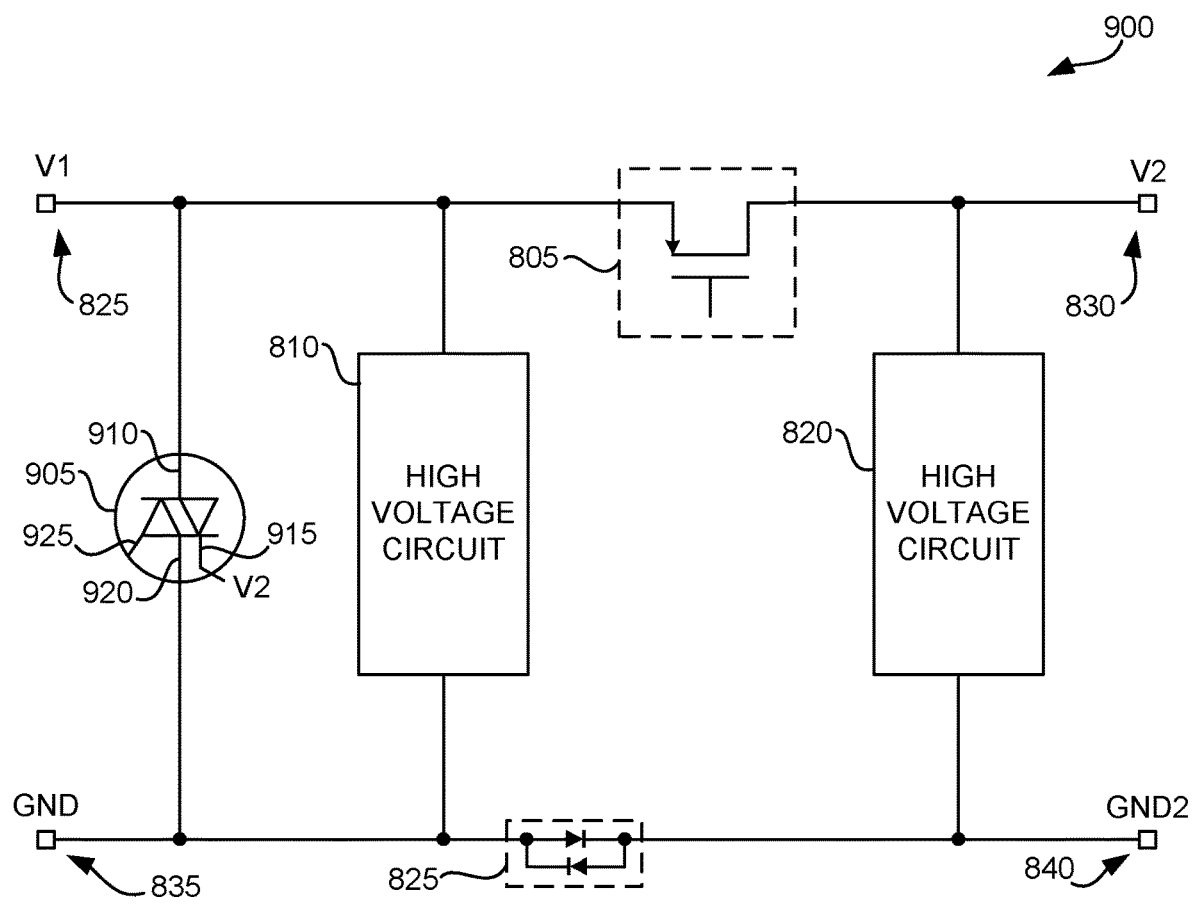
FIG. 9 illustrates a diagram of an example of circuitry including a TRIAC-based ESD device having at least three anodes or cathodes to provide ESD protection.

FIG. 9 illustrates an example of circuitry 900 including an NPNP/PNPN or TRIAC-based ESD device (hereinafter, "TRIAC ESD device") 905 having at least three anodes/cathodes to provide ESD protection. Circuitry 900 is a modified example of circuitry 800, with the modification including the replacement of SCR ESD device 810 with TRIAC ESD device 905. As with a conventional TRIAC, TRIAC ESD device 905 includes a first and second anode/cathode 910 and 920 and a gate 925. TRIAC ESD device 905 improves on conventional TRIAC devices by the inclusion of a third anode/cathode 915. As shown in FIG. 9, anodes/cathodes 910 and 920 are coupled, respectively, to node 825 and reference node 835, so as to trigger TRIAC ESD device 905 to conduct positive or negative ESD current from node 825 to node 835 during an ESD event. Anode/cathode 915 is coupled to node 830 and operates as a second trigger for turning on TRIAC ESD device 905 to conduct ESD current to reference node 835 during an ESD event. In an example, anode/cathode 915 operates as both a trigger and a path for conducting ESD current to flow from node 825 or 830 to reference node 835 or 840. In another example, anode/cathode 915 only operates as a trigger for turning on TRIAC ESD device 905.

Figure 10A:
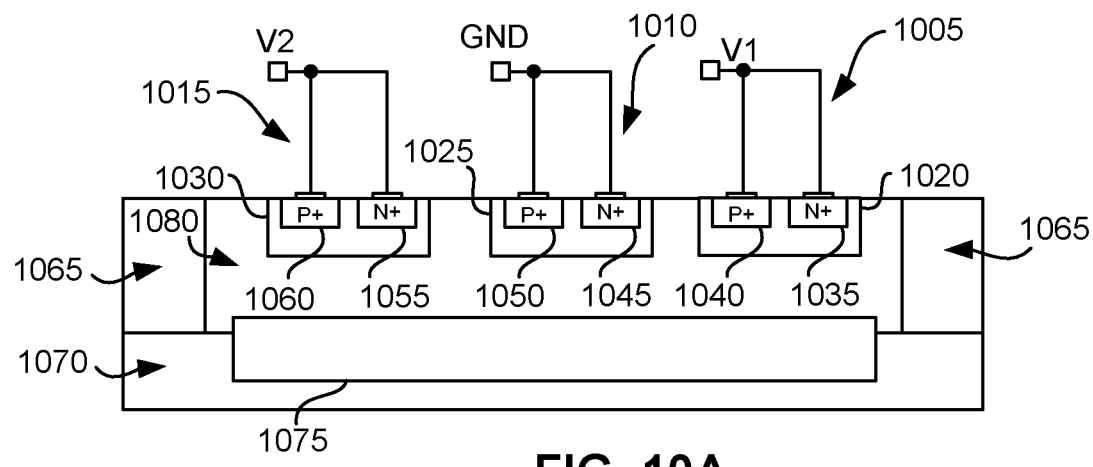
FIGS. 10A and 10B illustrate cross-sectional diagrams of examples of a TRIAC-based ESD device having at least three anodes or cathodes to provide ESD protection.

FIG. 10A illustrates a cross-sectional diagram of an example of TRIAC ESD device 905. More specifically, FIG. 10A illustrates an example of a configuration of TRIAC ESD device 905 having a third anode/cathode 915 that is configured to provide a second trigger for turning on the ESD device and to provide a path for conducting current away from a designated or specified node, such as node 825 or node 830. As shown in FIG. 10A, TRIAC ESD device 905 includes anode/cathode 1005 formed in p-type region 1020 by n+ region 1035 and p+ region 1040, anode/cathode 1010 formed in p-type region 1025 by n+ region 1045 and p+ region 1050, and anode/cathode 1015 formed in p-type region 1030 by n+ region 1055 and p+ region 1060. TRIAC ESD device 905 further includes isolation structure region 1065, gate region 1080, buried n+ region 1075 and p-type substrate 1070. The anodes/cathodes 1005, 1010, and 1015 correspond, respectively, to the anode/cathodes 910, 920, and 915.

Figure 10B:
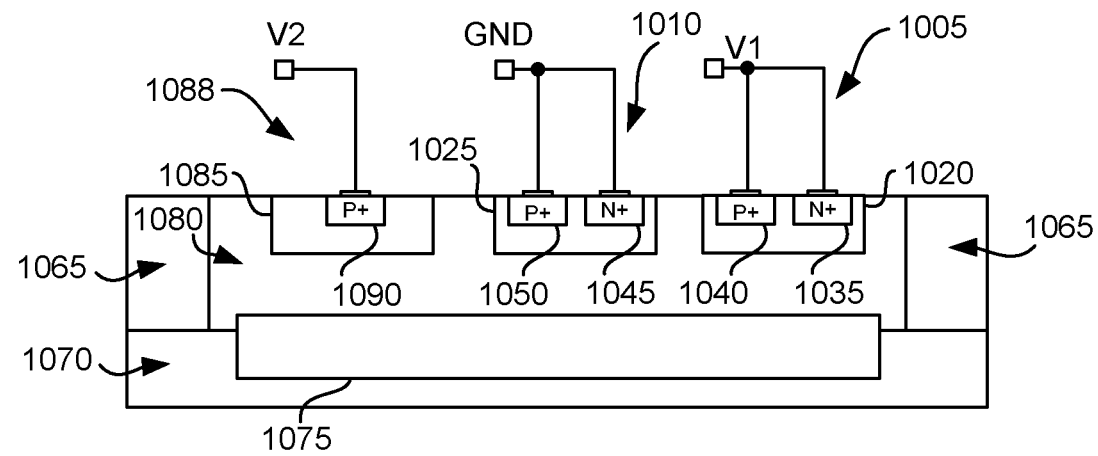

FIG. 10B illustrates a cross-sectional diagram of an example of TRIAC ESD device 905. More specifically, FIG. 10B illustrates an example of a configuration of TRIAC ESD device 905 having a third anode/cathode 915 that is configured to provide a second trigger for turning on the ESD device to conduct ESD current away from a protected or designated node, such as node 825 or node 830. TRIAC ESD device 905, as shown in FIG. 10B, is a modified example of the TRIAC ESD device shown in FIG. 10A, with the modification including replacing anode/cathode 1015 with the anode 1088, which is formed in p− type region 1085 by p+ region 1090.

The circuits and cross-sectional diagrams illustrated in the figures and described herein include examples of different configurations of the ESD devices of the present disclosure. A feature, or the relative size or position of a feature with respect to another feature, of an ESD device that is depicted in a first figure may be included in or implemented as a corresponding feature in a second figure where reasonable notwithstanding the absence of the feature in the second illustration. More specifically, features illustrated in different figures or drawings of similar ESD devices may be combined in different combinations than shown in the figures or drawings where such combinations are reasonably anticipated. In an example, a first device structure that is illustrated in a cross-sectional diagram as being disposed or fabricated laterally (e.g., to the left or to the right) relative to a second device structure can be disposed or fabricated at other positions or orientations relative to such second device structure. The first device structure can, for example; be disposed or fabricated in front of, or behind, or at least partially circumscribing, the second device structure.

The circuits, circuitry, or devices illustrated in the figures and described herein are illustrated or described with respect to specified electrical polarities, such as positive or negative voltages or currents, and device dopant or charge carrier configurations, such as NPN verses PNP or n-type material verses p-type material, to improve the clarity of the discussion. Such electrical polarities or devices dopant or charge carrier configurations can be reversed or swapped where readily appreciable without loss of generally to the techniques of devices described herein.

Aspects of the present disclosure include illustrations and discussions of diagrams showing possible layouts of semiconductor devices. Such devices can be fabricated according to any suitable technique, process, or technology, for fabricating semiconductor devices, such as BJTs, SCRs, TRIACs, and the like. The diagrams and structures illustrated and described herein can correspond to analogous diagrams or structures in such suitable fabrication technique, process, or technology. Such techniques, in various examples, CMOS, Bipolar-CMOS-DMOS, Gallium, or Silicon-Carbide based techniques.

VARIOUS EXAMPLES

Example 1 is a system having a device for conducting an electrostatic discharge (ESD) current from a designated pin node, the system comprising: first and second pin nodes; and a switching device having a first switching threshold, the switching device comprising: a first terminal, coupled to a reference node; a second terminal, coupled to the first pin node, to actuate the switching device to conduct ESD current from the first pin node responsive to a voltage between the first pin node and the reference node exceeding the first switching threshold; and a third terminal, coupled to the second pin node, to actuate the switching device to conduct ESD current from the first pin node responsive to a voltage between the first pin node and the second pin node exceeding a second switching threshold.

In Example 2, the subject matter of Example 1 includes, a first power supply node coupled to the pin node; and a second power supply node coupled to the second pin node, the first power supply node to provide power to second power supply node.

In Example 3, the subject matter of Example 2 includes, wherein the first pin node is coupled to circuitry that is coupled to both the first power supply and to the second power supply.

In Example 4, the subject matter of Examples 1-3 includes, wherein the switching device comprises a bipolar junction transistor (BJT), the BJT comprising: a base region coupled to the first terminal; a collector region coupled to the second terminal; first emitter region to determine, in association with the base region, the first switching threshold; and a second emitter region coupled to the third terminal, to determine, in association with the base region, the second switching threshold.

In Example 5, the subject matter of Example 4 includes, wherein: the base region is electrically shorted to the first emitter region; and at least one electrical component of the system is coupled between the base region and the second emitter region.

In Example 6, the subject matter of Example 5 includes, wherein the at least one electrical component comprises a resistive element to inhibit conduction of the ESD current though the second emitter region.

In Example 7, the subject matter of Examples 4-6 includes, wherein the first emitter region and the second emitter region are each formed at least partially within the base region.

In Example 8, the subject matter of Example 7 includes, a base contact region to couple the base region to the first terminal, the base contact region comprising a semiconductor material having a higher dopant concentration than a dopant concentration of the base region.

In Example 9, the subject matter of Example 8 includes, wherein the base contact region is laterally disposed between the first emitter region and the second emitter region.

In Example 10, the subject matter of Examples 8-9 includes, wherein the first emitter region is laterally disposed between the base contact region and the second emitter region.

In Example 11, the subject matter of Examples 8-10 includes, wherein the base region is electrically isolated from a substrate of the BJT.

In Example 12, the subject matter of Examples 1-11 includes, wherein the switching device comprises a semiconductor-controlled rectifier (SCR), the SCR comprising: a base region coupled to the first terminal; an anode region coupled to the second terminal; first cathode region to determine, in association with the base region, the first switching threshold; and a second cathode region coupled to the third terminal, to determine, in association with the base region, the second switching threshold, wherein the first cathode region and the second cathode region are each formed at least partially within the base region.

In Example 13, the subject matter of Examples 1-12 includes, wherein the switching device comprises an SCR, the SCR comprising: a buried region of first conductivity type; a gate region of the conductivity type, the gate region disposed adjacent to the buried region; first; second, and third doped regions of a second conductivity type and formed at least partially within the gate region; an anode region of the second conductivity type formed in the first doped region and coupled to the second terminal; a first cathode region of the first conductivity type formed in the second doped region and coupled to the first terminal to determine the first switching threshold; and a second cathode region of the first conductivity type formed in the third doped region and coupled to the third terminal to determine the second switching threshold.

In Example 14, the subject matter of Examples 1-13 includes, wherein the switching device comprises a bidirectional triode thyristor (TRIAC), the TRIAC comprising: a buried region of first conductivity type; a gate region of the conductivity type, the gate region disposed adjacent to the buried region; and first, second, and third anode regions spaced apart and coupled, respectively, to the first, second, and third terminals, each anode region formed in a doped region of a second conductivity type, each doped region comprising a first doped region of the first conductivity type and a second doped region of the second conductivity type.

In Example 15, the subject matter of Examples 1-14 includes, wherein the switching device comprises a bidirectional triode thyristor (TRIAC), the TRIAL comprising: a buried region of first conductivity type; a gate region of the conductivity type, the gate region disposed adjacent to the buried region; and first, second, and third anode regions spaced apart and coupled, respectively, to the first, second, and third terminals, wherein: the first and second anode regions each comprises a first doped region of the first conductivity type and a second doped region of the second conductivity type; and the third anode region comprises a third doped region of the first conductivity type.

Example 16 is a semiconductor device for discharging an electrostatic discharge (ESD) current from a pin node of a circuit, the semiconductor device comprising: a first terminal to couple to a reference node; a second terminal to couple to a first pin node, to actuate the semiconductor device conduct an electrical current from the first pin node through the second terminal responsive to a voltage the first terminal exceeding a first switching threshold voltage; and a third terminal to couple to a second pin node, to actuate the semiconductor device to an electrical current from the first pin node responsive to a voltage at the third terminal exceeding a second switching threshold voltage.

In Example 17, the subject matter of Example 16 includes, wherein the semiconductor device comprises a NPNP device, the NPNP comprising: a base region coupled to the first terminal; an anode region coupled to the second terminal; first cathode region to determine, in association with the base region, the first switching threshold voltage; and a second cathode region coupled to the third terminal, to determine, in association with the base region, the second switching threshold voltage, wherein the first cathode region and the second cathode region are each formed at least partially within the base region.

In Example 18, the subject matter of Examples 16-17 includes, wherein the semiconductor device comprises a bidirectional triode thyristor (TRIAC), the TRIAC comprising: a buried region of first conductivity type; a gate region of the conductivity type, the gate region disposed adjacent to the buried region; and first, second, and third anode regions spaced apart and coupled, respectively, to the first, second, and third terminals, each anode region formed in a doped region of a second conductivity type, each doped region comprising a first doped region of the first conductivity type and a second doped region of the second conductivity type.

In Example 19, the subject matter of Examples 16-18 includes, wherein the semiconductor device comprises a bidirectional triode thyristor (TRIAC), the TRIAC comprising: a buried region of first conductivity type; a gate region of the conductivity type, the gate region disposed adjacent to the buried region; and first, second, and third anode regions spacpart and coupled, respectively, to the first, second, and third terminals, wherein: the first and second anode regions each comprises a first doped region of the first conductivity type and a second doped region of the second conductivity type; and the third anode region comprises a third doped region of the first conductivity type.

Example 20 is a switching device for discharging an electrostatic discharge (ESD) current from a pin node of a circuit, the switching device comprising: means for actuating the switching device to conduct an electrical current from a first pin node through a first terminal of the switching device responsive to a voltage at the first terminal exceeding a first switching threshold voltage; means for actuating the switching device to conduct an electrical current from the first pin node through the first terminal of the switching device responsive to a voltage at a second terminal of the switching device exceeding a second switching threshold voltage; and means for conducting a current from the switching device through a third terminal of the switching device to a reference node.

In Example 21, the subject matter of Example 20 includes, wherein the switching device comprises at least one of an SCR, TRIAC, or a bipolar junction transistor.

Example 22 is at least one machine-readable medium including instructions that, when executed by processing circuitry, cause the processing circuitry to perform operations to implement of any of Examples 1-21.

Example 23 is an apparatus comprising means to implement of any of Examples 1-21.

Example 24 is a system to implement of any of Examples 1-21.

Example 25 is a method to implement of any of Examples 1-21.

The above detailed description includes references to the accompanying drawings, which form a part of the detailed description. The drawings show, by way of illustration, specific embodiments in which the invention can be practiced. These embodiments are also referred to generally as "examples." Such examples can include components in addition to those shown or described. However, the present inventors also contemplate examples in which only those components shown or described are provided. Moreover, the present inventors also contemplate examples using any combination or permutation of those components shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes components in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system having a device for conducting an electrostatic discharge (ESD) current from a designated pin node, the system comprising:
   first and second pin nodes; and
   a switching device having a first switching threshold, the switching device comprising:
      a first terminal, coupled to a reference node;
      a second terminal, coupled to the first pin node, to actuate the switching device to conduct ESD current from the first pin node responsive to a voltage between the first pin node and the reference node exceeding the first switching threshold; and
      a third terminal, coupled to the second pin node, to actuate the switching device to conduct ESD current from the first pin node responsive to a voltage between the first pin node and the second pin node exceeding a second switching threshold.

2. The system of claim 1, further comprising:
   a first power supply node coupled to the pin node; and
   a second power supply node coupled to the second pin node, the first power supply node to provide power to second power supply node.

3. The system of claim 2, wherein the first pin node is coupled to circuitry that is coupled to both the first power supply and to the second power supply.

4. The system of claim 1; wherein the switching device comprises a bipolar junction transistor (BJT), the BJT comprising:
   a base region coupled to the first terminal;
   a collector region coupled to the second terminal;
   first emitter region to determine, in association with the base region, the first switching threshold; and
   a second emitter region coupled to the third terminal, to determine, in association with the base region, the second switching threshold.

5. The system of claim 4, wherein:
   the base region is electrically shorted to the first emitter region; and
   at least one electrical component of the system is coupled between the base region and the second emitter region.

6. The system of claim 5, wherein the at least one electrical component comprises a resistive element to inhibit conduction of the ESD current though the second emitter region.

7. The system of claim 4, wherein the first emitter region and the second emitter region are each formed at least partially within the base region.

8. The system of claim 7, further comprising a base contact region to couple the base region to the first terminal, the base contact region comprising a semiconductor material having a higher dopant concentration than a dopant concentration of the base region.

9. The system of claim 8, wherein the base contact region is laterally disposed between the first emitter region and the second emitter region.

10. The system of claim 8, wherein the first emitter region is laterally disposed between the base contact region and the second emitter region.

11. The system of claim 8, wherein the base region is electrically isolated from a substrate of the BJT.

12. The system of claim 1, wherein the switching device comprises a semiconductor-controlled rectifier (SCR), the SCR comprising:
   a base region coupled to the first terminal;
   an anode region coupled to the second terminal;
   first cathode region to determine, in association with the base region, the first switching threshold; and
   a second cathode region coupled to the third terminal, to determine, in association with the base region, the second switching threshold, wherein the first cathode region and the second cathode region are each formed at least partially within the base region.

13. The system of claim 1, wherein the switching device comprises an SCR, the SCR comprising:
   a buried region of first conductivity type;
   a gate region of the conductivity type, the gate region disposed adjacent to the buried region;
   first, second, and third doped regions of a second conductivity type and formed at least partially within the gate region;
   an anode region of the second conductivity type formed in the first doped region and coupled to the second terminal;
   a first cathode region of the first conductivity type formed in the second doped region and coupled to the first terminal to determine the first switching threshold; and
   a second cathode region of the first conductivity type formed in the third doped region and coupled to the third terminal to determine the second switching threshold.

14. The system of claim 1, wherein the switching device comprises a bidirectional triode thyristor (TRIAC), the TRIAC comprising:
   a buried region of first conductivity type;
   a gate region of the conductivity type, the gate region disposed adjacent to the buried region; and
   first, second, and third anode regions spaced apart and coupled, respectively, to the first, second, and third terminals, each anode region formed in a doped region of a second conductivity type, each doped region comprising a first doped region of the first conductivity type and a second doped region of the second conductivity type.

15. The system of claim 1, wherein the switching device comprises a bidirectional triode thyristor (TRIAC), the TRIAC comprising:
   a buried region of first conductivity type;
   a gate region of the conductivity type, the gate region disposed adjacent to the buried region; and
   first, second, and third anode regions spaced apart and coupled, respectively, to the first, second, and third terminals, wherein:
      the first and second anode regions each comprises a first doped region of the first conductivity type and a second doped region of the second conductivity type; and
      the third anode region comprises a third doped region of the first conductivity type.

16. A semiconductor device for discharging an electrostatic discharge (ESD) current from a pin node of a circuit, the semiconductor device comprising:
   a first terminal to couple to a reference node;

a second terminal to couple to a first pin node, to actuate the semiconductor device conduct an electrical current from the first pin node through the second terminal responsive to a voltage the first terminal exceeding a first switching threshold voltage; and a third terminal to couple to a second pin node, to actuate the semiconductor device to an electrical current from the first pin node responsive to a voltage at the third terminal exceeding a second switching threshold voltage.

17. The semiconductor device of claim 16, wherein the semiconductor device comprises a NPNP device, the NPNP comprising:

a base region coupled to the first terminal;

an anode region coupled to the second terminal;

first cathode region to determine, in association with the base region, the first switching threshold voltage; and a second cathode region coupled to the third terminal, to determine, in association with the base region, the second switching threshold voltage, wherein the first cathode region and the second cathode region are each formed at least partially within the base region.

18. The semiconductor device of claim 16, wherein the semiconductor device comprises a bidirectional triode thyristor (TRIAC), the TRIAC comprising:

a buried region of first conductivity type;

a gate region of the conductivity type, the gate region disposed adjacent to the buried region; and first, second, and third anode regions spaced apart and coupled, respectively, to the first, second, and third terminals, each anode region formed in a doped region of a second conductivity type, each doped region comprising a first doped region of the first conductivity type and a second doped region of the second conductivity type.

19. The semiconductor device of claim 16, wherein the semiconductor device comprises a bidirectional triode thyristor (TRIAC), the TRIAC comprising:

a buried region of first conductivity type;

a gate region of the conductivity type, the gate region disposed adjacent to the buried region; and first, second, and third anode regions spaced apart and coupled, respectively, to the first, second, and third terminals, wherein:

the first and second anode regions each comprises a first doped region of the first conductivity type and a second doped region of the second conductivity type; and the third anode region comprises a third doped region of the first conductivity type.

20. A switching device for discharging an electrostatic discharge (ESD) current from a pin node of a circuit, the switching device comprising:

means for actuating the switching device to conduct an electrical current from a first pin node through a first terminal of the switching device responsive to a voltage at the first terminal exceeding a first switching threshold voltage;

means for actuating the switching device to conduct an electrical current from the first pin node through the first terminal of the switching device responsive to a voltage at a second terminal of the switching device exceeding a second switching threshold voltage; and means for conducting a current from the switching device through a third terminal of the switching device to a reference node.

21. The switching device of claim 20, wherein the switching device comprises at least one of an SCR, TRIAC, or a bipolar junction transistor.

* * * * *